(12) United States Patent
Pike

(10) Patent No.: US 6,240,874 B1
(45) Date of Patent: Jun. 5, 2001

(54) INTEGRATED EDGE EXPOSURE AND HOT/COOL PLATE FOR A WAFER TRACK SYSTEM

(75) Inventor: Christopher L. Pike, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/320,685

(22) Filed: May 27, 1999

(51) Int. Cl.[7] .............................. B05C 11/00; B05C 9/14; B05C 11/08; B05D 3/06
(52) U.S. Cl. .................... 118/666; 118/667; 118/620; 118/58; 118/320; 427/559
(58) Field of Search .................... 118/666, 667, 118/58, 620, 59, 320; 219/444; 427/553, 558, 559; 355/67, 50

(56) References Cited

U.S. PATENT DOCUMENTS 5,639,301 * 6/1997 Sanada et al. ......................... 118/52
6,089,763 * 7/2000 Choi et al. ............................ 396/611

* cited by examiner

*Primary Examiner*—Curtis Mayes
*Assistant Examiner*—J. A. Lorengo
(74) *Attorney, Agent, or Firm*—Davis Chin

(57) ABSTRACT

There is provided an improved resist coating/developing processing method and apparatus for a wafer track system so as to increase its throughput. In a preferred embodiment, this is achieved by integrating a wafer edge exposure unit with a temperature control plate unit into a single integrated processing unit having the functionality of the two separate processing units.

8 Claims, 3 Drawing Sheets

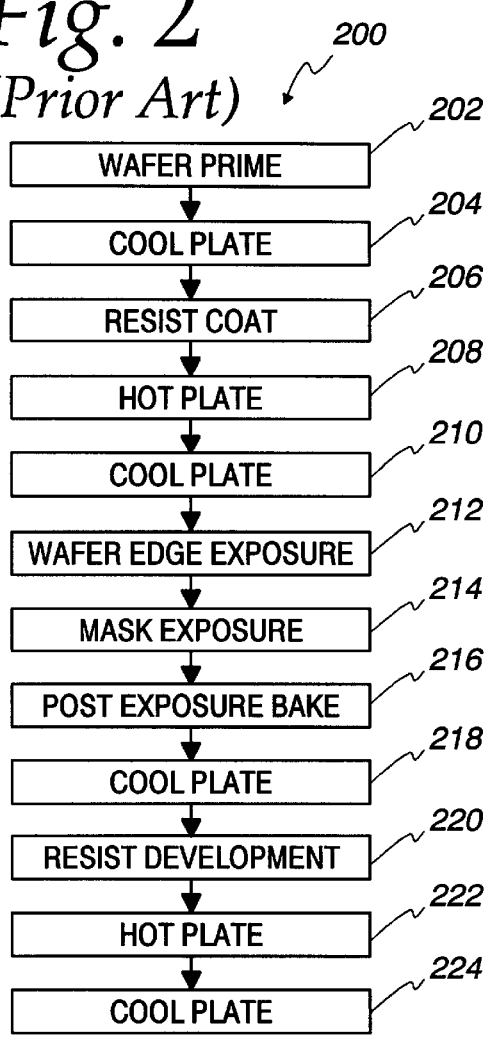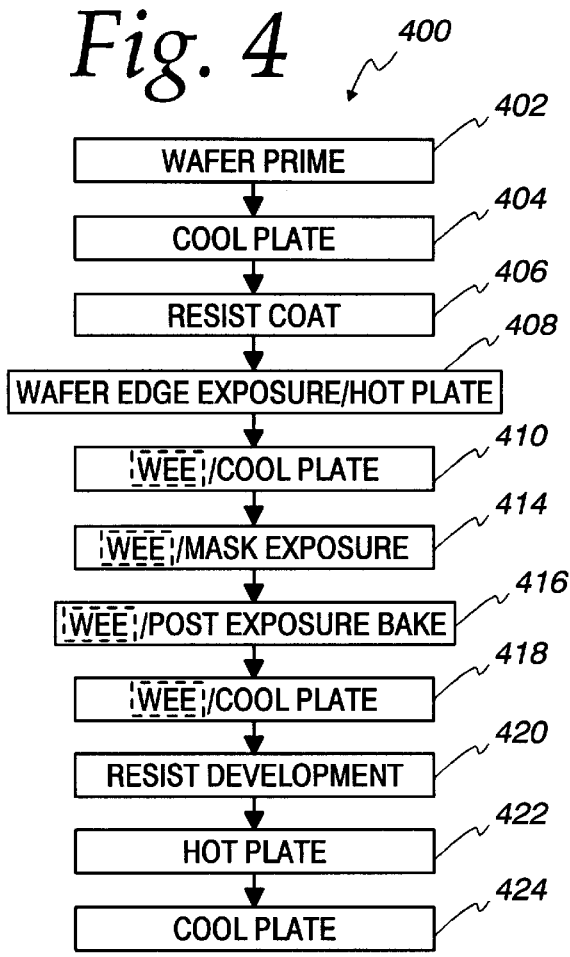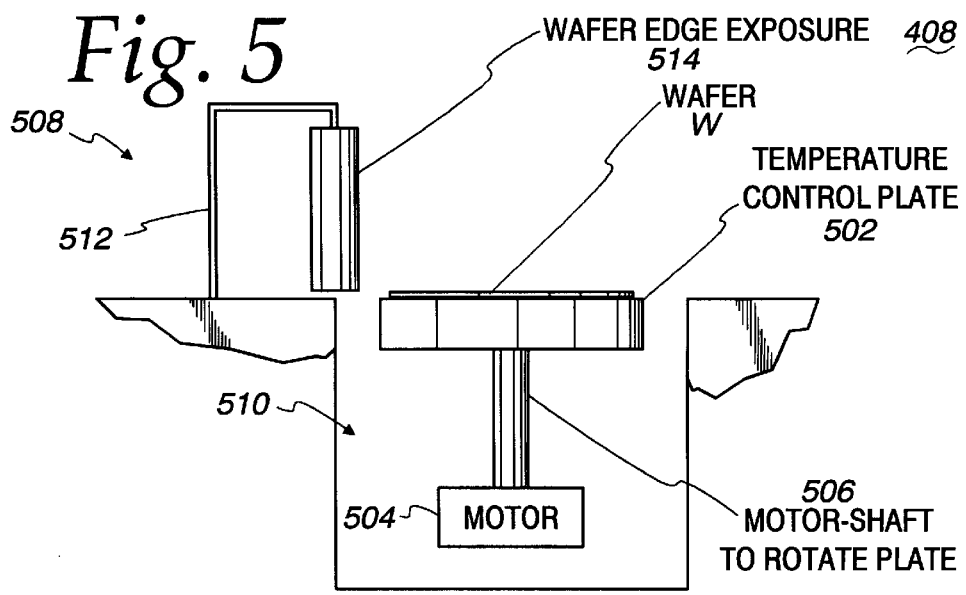

INTEGRATED EDGE EXPOSURE AND HOT/COOL PLATE FOR A WAFER TRACK SYSTEM

BACKGROUND OF THE INVENTION

This invention relates generally to semiconductor processing apparatus and more particularly, it relates to a resist coating/developing processing method and apparatus for a wafer track system which integrates an edge exposure unit and a hot/cool plate unit so as to increase the throughput.

As is generally known in the art, a series of processes are required to be performed during the manufacturing of a semiconductor device. One such process is referred to as a "photolithographic or resist process" in which a resist coating is applied to a wafer, the wafer is then exposed, and thereafter the wafer is developed. There are several known types of systems which are commercially available for performing the resist coating/developing processing on a semiconductor wafer. For example, in industrial semiconductor fabrication facilities, there are used normally automated photoresist processing systems sometimes called "wafer track systems." Such a prior art wafer track system is illustrated in FIG. 1.

As can be seen, the wafer track system 10 includes a loader station 12 for loading and unloading cassettes containing wafers to be processed, a resist coating station 14 for applying a coat of positive tone resist, a heat treatment station 16 and a developing station 18 for developing the exposed wafer and rinsing the developed circuit pattern. The heat treatment station 16 includes a hot plate unit and/or a cool plate unit for controlling the wafer to be at a predetermined temperature. Further, a wafer edge exposure station 20 is positioned in a suitable arrangement with the loader station 12, resist coating station 14, heat treatment station 16, and developing station 18 so as to perform the series of processes in an effective manner. The wafer edge expose station 20 is used to expose the resist coating at the peripheral edge portion of the wafer so as to make it base soluble for subsequent processes.

A photolithographic process flow diagram 200 for performing the resist coating/developing process steps as shown in FIG. 2, which is utilized in the wafer track system of FIG. 1, will now be described. Before the wafer is primed in step 202 of FIG. 2, it is generally known that a dehydration bake step (pre-treatment step) is required so as to remove fluids from the wafer before subsequent resist coating/developing processing steps can be carried out. In this pre-treatment step, the wafer stored in the cassette is moved to a hot plate or infrared lamp oven where baking off most of the absorbed water on the surface of the wafer occurs at approximately 150–200° C. in either a vacuum or a dry nitrogen atmosphere. After the dehydration baking step, the wafer is primed in the step 202 with hexamethyldisilazane (HMDS) which acts as an adhesion promoter. In other words, this priming will improve the adhesion of the photoresist to the wafer so as to reduce the amount of undercutting during the etching process.

After the wafer is primed in the step 202, the wafer is moved to a cool plate as shown in step 204 in which the wafer is cooled down to a predetermined temperature. Next, the wafer is coated with a photoresist, such as a polyimide-based resist having a relatively high viscosity in step 206. The most common method for applying the photoresist is referred to as "spin coating." Initially, the wafer is mounted on a spin chuck, which is a flat, hollow metal disc connected to a vacuum line. The spin chuck has a number of small holes disposed on its surface. When the wafer is placed on the surface of the chuck, the vacuum holds the wafer in contact engagement with the chuck. Then, a predetermined amount of resist is disposed and spun onto the surface of the wafer. After the wafer is coated with resist, the wafer is transferred to a hot plate in step 208 for a "soft bake" operation. This baking operation is used to drive out most of the solvents in the photoresist and to establish the exposure characteristics.

Following the soft bake, the wafer is cooled on a cool plate to a desired temperature in step 210 and then is exposed so as to render the wafer edge water soluble in step 212. Next, in step 214 a mask exposure is performed so as to apply a circuit pattern to the photoresist. After the step 214, a post exposure bake or "hard bake" operation is performed in step 216 so as to make the photoresist that remains impervious to etchents. Then, the wafer is again cooled on a cool plate to a desired temperature in step 218. Next, the wafer is developed in step 220 where a developing solution is applied to the upper surface of the wafer which has the resist coating already applied, followed by a rinse solution so as to wash away the developing solution. After the developing step 220, the wafer is transferred to a hot plate in step 222 so as to perform a hard bake for hardening the resist against further energetic processes. Finally, the wafer is cooled down to a predetermined temperature in the cool plate as shown in step 224.

In view of the number of various processing steps that the wafer is required to be passed through during fabrication as discussed above, it will be noted that the throughput for the wafer track system of FIG. 1 is a function of the required number of overall processing steps (steps 202–224) and the amount of time that is spent in each of the processing steps. One way of increasing the throughput of the track system is to provide multiple identical processing units for performing the same process so that the wafer can be processed in parallel. A second way of increasing the throughput is to reduce the amount of time that is being spent in each processing unit.

Each of these two ways has its own inherent disadvantages. The inventor of the present invention has thus developed a third way of increasing the throughput of the wafer track system by integrating or combining together two of the separate individual processing units into a new single integrated processing unit having the functionality of the two separate processing units.

SUMMARY OF THE INVENTION

Accordingly, it is a general object of the present invention to provide a resist coating/developing processing method and apparatus for a wafer track system which has an increased throughput over the conventional track system.

It is an object of the present invention to provide a resist coating/developing processing method for a wafer track system which integrates together two separate individual processing units into a new single integrated processing unit having the functionality of the two separate processing units.

It is another object of the present invention to provide a resist coating/developing processing method and apparatus for a wafer track system which integrates a wafer edge exposure unit and a temperature control plate unit so as to increase its throughput.

It is still another object of the present invention to provide a resist coating/developing processing method and apparatus for a wafer track system which integrates a wafer edge exposure unit and another processing unit located between a resist coating unit and a resist development unit into a single integrated processing unit.

In a preferred embodiment of the present invention, there is provided an improved resist coating/developing processing method for use in a wafer track system so as to increase its throughput. A photoresist is applied in a resist coating processing unit to a wafer. An integrated heat treatment/ wafer edge exposure processing unit is used to heat treat the wafer and expose the wafer edge after the photoresist has been applied. A developing solution is applied to the wafer in a resist development processing unit so as to remove the exposed resist after the wafer has been heat treated and exposed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a photolithographic process flow diagram for performing the resist coating/develop process, which is used in the wafer track system of FIG. 1;

FIG. 4 is an improved photolithographic process flow diagram for performing the resist coating/developing process, according to the principles of the present invention; and FIG. 5 is a simplified pictorial view of an integrated processing unit for combining a wafer edge exposure unit and a hot/cool plate unit.

DESCRIPTION OF THE PREFERRED EMBODIMENT

Figure 1:
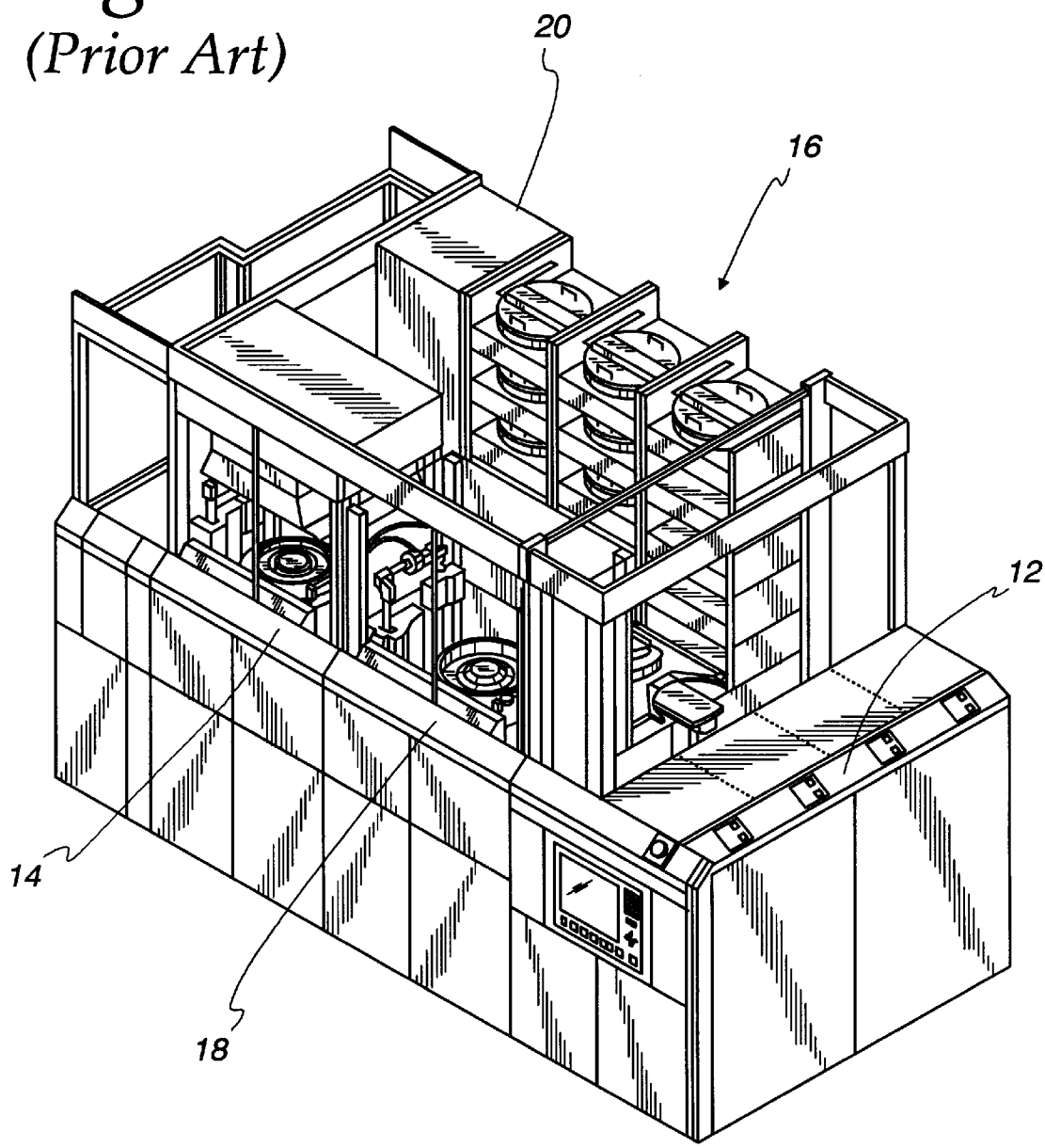
FIG. 1 is a perspective view of a conventional wafer track system utilizing a standard resist coating/develop process for a semiconductor wafer.

One of the major concerns faced by semiconductor manufacturers during the mass-production of semiconductor integrated circuit devices is to increase efficiently the throughput of the wafers used in the production of such semiconductor devices. The purpose of this invention is to provide a method and apparatus for enhancing on an efficient and effective basis the throughput of the wafers during a resist coat/ develop process, but yet maintains the same functionality. In view of this, the inventor of the instant invention has developed a way of combining the functionality of a wafer edge exposure unit with the functionality of a hot plate unit in order to reduce the number of process units that a wafer must be passed through during fabrication. Accordingly, the required modifications to the resist coat/develop process in a conventional wafer track system are minimal and thus do not increase significantly the manufacturing cost.

Referring again to FIG. 2, it can be seen that in order to maintain the same functionality the combining of multiple separate processing units into an integrated processing unit must be performed only between the resist coat step 206 and the resist development step 220. This is due to the fact that the resist coat must have been applied to the wafer before it is exposed and the exposed resist is removed during the development.

In FIG. 4 of the drawings, there is shown an improved photolithographic process flow diagram 400 for performing a resist coat/develop process in accordance with the teachings of the present invention. It should be noted that the process flow diagram 400 of FIG. 4 is substantially identical to the flow diagram 200 of FIG. 2, except that the wafer edge exposure step 212 of FIG. 2 has now been combined or integrated into step 408 which is now a combination of a wafer edge exposure/hot plate unit so that the throughput of the wafer track system can be increased without any loss in functionality or performance.

As can be seen, the process flow diagram 400 includes the process steps (process units) of wafer prime 402, cool plate 404, resist coat 406, wafer edge exposure/hot plate 408, cool plate 410, mask exposure 414, post exposure bake 416, cool plate 418, resist development 420, hot plate 422 and cool plate 424. By comparing this flow diagram 400 with the flow diagram 200 of FIG. 2, it will be noted that the flow diagram requires only eleven (11) steps or process units instead of the twelve (12) steps in the flow diagram 200. If it is assumed that the wafer spends an equal amount of time in each of the process units 202–224, then the integration of the wafer edge exposure unit 212 with the hot plate unit 208 into one integrated processing unit 408 in FIG. 4 will reduce the process time of the wafer by approximately 8 percent.

In FIG. 5, there is illustrated a simplified pictorial view of a way for implementing the integrated processing unit 408 of FIG. 4 so as to achieve the combined functionality. The integrated processing unit 408 is comprised of a temperature control plate 502 defining a hot plate, a motor 504, a shaft 506 for coupling the motor 504 to the temperature control plate 502, and a wafer edge exposure device 508.

The temperature control plate 502, shaft 506, and motor 504 are positioned in a recessed chamber 510 so that the top surface of the temperature control plate 502 is flush with the upper cylindrical edge of the chamber 510. The temperature control plate 502 may be equipped with a vacuum suction mechanism so as to retain a wafer W on its top surface. The wafer edge exposure device 508 is comprised of an L-shaped bracket or frame 512 which is mounted on the cylindrical edge of the chamber 510. The frame 514 is used to hold vertically a light source 514 so that its lower end thereof is aligned against the edge of the wafer W.

In operation, the bracket 512 is fixedly secured on top of the edge of the chamber 510 so that the light source 514 is not movable. The wafer W is held under vacuum to the top surface of the temperature control plate 502 while it is being rotated. Thus, the entire peripheral edge of the wafer will become exposed. Alternatively, the temperature control plate 502 and the shaft 506 may be permanently secured in position so that the wafer W is not movable. Then, the wafer edge exposure device 508 is moved around the perimeter of the wafer W by rotating the chamber.

Figure 3:
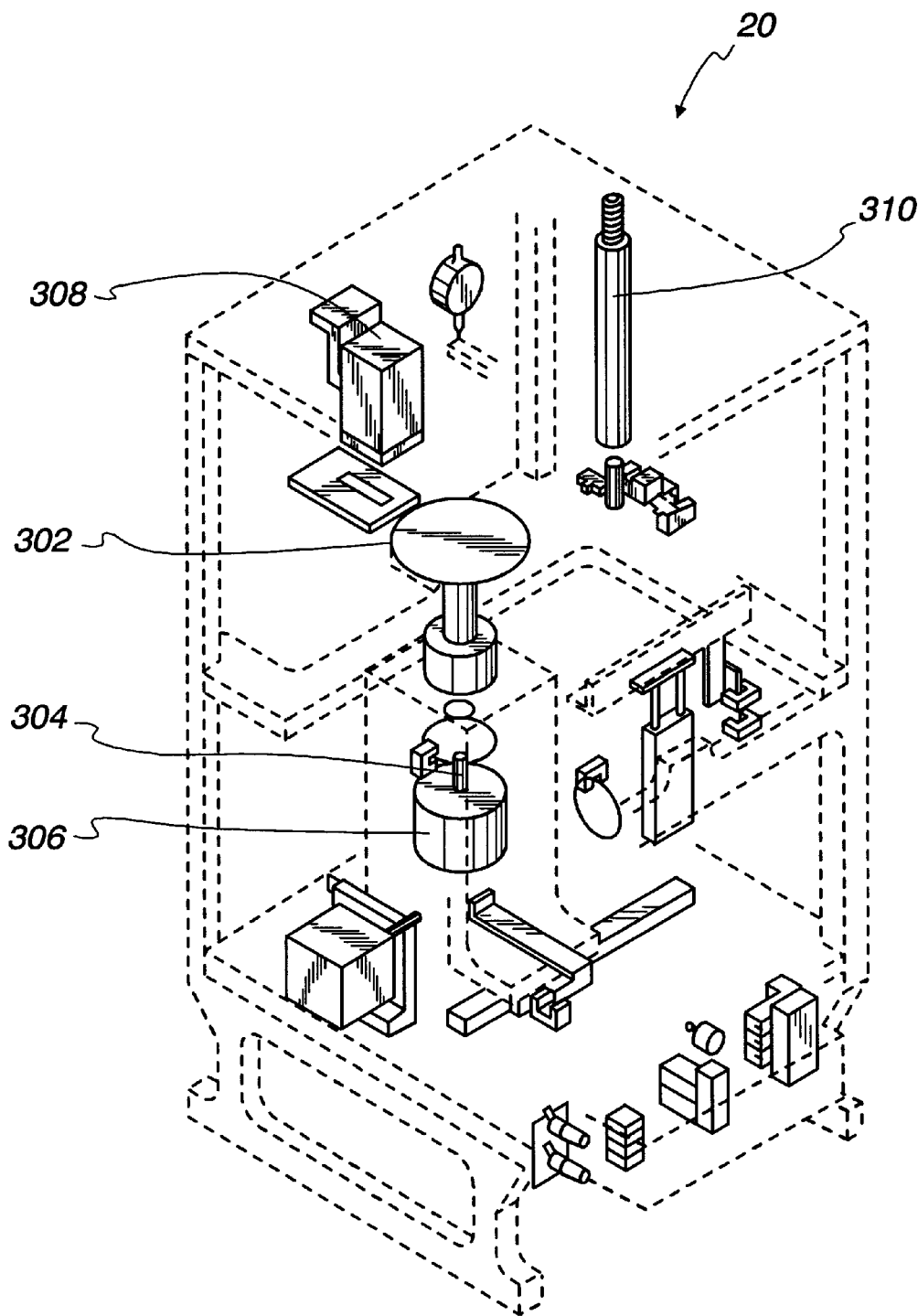
FIG. 3 is an exploded view of a wafer edge exposure unit of the wafer track system of FIG. 1, illustrating its components.

In FIG. 3, there is shown an exploded view of a wafer edge exposure unit of the wafer track system of FIG. 1. The wafer edge exposure unit 20 of FIG. 1 includes a wafer spin chuck 302 for supporting a wafer on its top surface. The spin chuck is connected to a shaft 304 which is rotated by a motor 306. The wafer edge exposure unit 20 further includes a laser diode 308 for sensing the wafer edge and an ultra-violet nozzle 310 for exposing the resist. As can be seen, the integrated processing unit 408 of FIG. 4 can be achieved very economically by replacing the wafer spin chuck 302 with the temperature control plate 502 of FIG. 5. Thus, this can be implemented with only minor modifications to the existing wafer edge exposure unit 20 of the conventional wafer track system 10 of FIG. 1.

Alternatively, the wafer edge exposure device in the processing unit 408 of FIG. 4 may be combined instead with the cool plate processing unit 410 rather than with the hot plate processing unit 408, or with the mask exposure unit 414, or with the post exposure bake processing unit 416, or the cool plate processing unit 418. As previously pointed out, the wafer edge exposure processing unit 212 may be integrated at any point in the flow process of FIG. 2 between the resist coat processing unit 206 and the resist development processing unit 220 in order to maintain the same functionality.

From the foregoing detailed description, it can thus be seen that the present invention provides an improved resist coating/developing processing method and apparatus for a wafer track system so as to increase its throughput. In a preferred embodiment, this is achieved by integrating or combining the wafer edge exposure unit with a hot plate processing unit into a new single processing unit having the same functionality of the two separate processing units.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A resist coating/develop processing apparatus for use in a wafer tracking system so as to increase its throughput comprising:

resist coating means for applying a photoresist to a wafer;

integrated means for heat treating of the wafer and exposing of the wafer edge after the photoresist has been applied;

said integrated means including an integrated heat treatment/wafer edge exposure processing unit; and resist development means for applying a developing solution to the wafer so as to remove the exposed resist after the wafer has been heat treated and exposed.

2. A resist coating/develop processing apparatus as claimed in claim 1, wherein said integrated heat treatment/wafer edge exposure processing unit includes a temperature control plate, a motor, a shaft for coupling the motor to the temperature control plate and a wafer edge exposure device.

3. A resist coating/develop processing apparatus as claimed in claim 2, wherein said temperature control plate is used to hold the wafer on its top surface while it is being rotated and wherein said wafer edge exposure device is held fixedly in position relative to the edge of the wafer.

4. A resist coating/develop processing apparatus as claimed in claim 2, wherein said temperature control plate is used to hold the wafer on its top surface in a fixed position and wherein said wafer edge exposure device is rotated around the peripheral edge of the wafer.

5. A resist coating/develop processing apparatus for use in a wafer track system so as to increase its throughput comprising:

a resist coating processing unit for applying a photoresist to a wafer;

an integrated heat treatment/wafer edge exposure processing unit for heat treating of the wafer and exposing of the wafer edge after the photoresist has been applied; and a resist development processing unit for applying a developing solution to the wafer so as to remove the exposed resist after the wafer has been heat treated and exposed.

6. A resist coating/develop processing apparatus as claimed in claim 5, wherein said integrated heat treatment/wafer edge exposure processing unit includes a temperature control plate, a motor, a shaft for coupling the motor to the temperature control plate and a wafer edge exposure device.

7. A resist coating/develop processing apparatus as claimed in claim 6, wherein said temperature control plate is used to hold the wafer on its top surface while it is being rotated and wherein said wafer edge exposure device is held fixedly in position relative to the edge of the wafer.

8. A resist coating/develop processing apparatus as claimed in claim 6, wherein said temperature control plate is used to hold the wafer on its top surface in a fixed position and wherein said wafer edge exposure device is rotated around the peripheral edge of the wafer.

* * * * *